United States Patent [19]

Furuta

[11] Patent Number: 5,004,934
[45] Date of Patent: Apr. 2, 1991

[54] SEMICONDUCTOR INTEGRATED CIRCUIT AND TEST METHOD FOR CHARACTERISTICS

[75] Inventor: Kouichi Furuta, Nara, Japan

[73] Assignee: Sharp Kabushiki Kaisha, Osaka, Japan

[21] Appl. No.: 302,469

[22] Filed: Jan. 27, 1989

[30] Foreign Application Priority Data

Jan. 27, 1988 [JP] Japan ................................. 63-16502

[51] Int. Cl.⁵ ......................... H03K 3/33; H03K 3/335
[52] U.S. Cl. .................................... 307/303; 328/167; 357/40
[58] Field of Search ..................... 357/40, 51; 307/303; 328/167

[56] References Cited

U.S. PATENT DOCUMENTS 4,797,578 1/1989 Eriksson ................................. 357/51

Primary Examiner—Stanley D. Miller
Assistant Examiner—Richard Roseen

[57] ABSTRACT

A semiconductor integrated circuit includes a circuit that has characteristics that can be changed by an electrical signal supplied from the outside of the integrated circuit. An output terminal that is used during the normal action of the semiconductor circuit is used as the output of the filter when testing the characteristics of the filter. A switching from the output terminal during normal action and during testing of the filter is performed by a plural mode switch.

14 Claims, 3 Drawing Sheets

SEMICONDUCTOR INTEGRATED CIRCUIT AND TEST METHOD FOR CHARACTERISTICS

BACKGROUND OF THE INVENTION

1. Field of the Invention

The present invention relates to a semiconductor integrated circuit and an inspection method for its characteristics. More particularly the invention relates to a semiconductor integrated circuit incorporating a characteristic changing circuit which changes characteristic in response to an external signal and to the method of testing characteristic of semiconductor integrated circuit.

2. Description of the Prior Art

As semiconductor technology has advanced it has come possible to integrate circuit elements to a high density on a single semiconductor integrated circuit chip. The composition of the semiconductor integrated circuit is complicated, and circuit elements possessing multiple functions are incorporated into a single semiconductor integrated circuit chip. Such chips are used in various electronic apparatus.

For example, in a semiconductor integrated circuit for processing multiplex voice signal in a television receiver, circuit elements requiring adjustment of characteristic of the circuit elements such as a filter, are often incorporated into a single semiconductor integrated circuit chip. In such a semiconductor integrated circuit, in addition to the input and output terminals necessary for the intrinsic action of this semiconductor integrated circuit, that is, the multiplex voice signal processing action, output terminals for adjustment in order to pick up signals necessary for adjusting the characteristic of the filter are separately provided.

In such semiconductor integrated circuit, it is necessary to provide the output terminals for adjustment in order to sense the filter output that is necessary only in the step of adjusting the filter characteristic, and these output terminals for adjustment occupy a large portion of the limited area of the semiconductor integrated circuit chip and its package leads. In particular, as multiple functions are incorporated into a single semiconductor integrated circuit, the number of input and output terminals has increased, and it is desired to achieve multiple functions by having a small number of terminals.

SUMMARY OF THE INVENTION

It is a primary object of the invention to provide a semiconductor integrated circuit and its characteristic test method which is capable of using an existing output terminal as an output terminal for characteristic changing circuit.

It is another object of the invention to provide a semiconductor integrated circuit and its characteristic test method which decreases the number of connecting terminals.

It is another object of the invention to provide a semiconductor integrated circuit that can be easily tested and to easily adjust the characteristic of a changing circuit which is incorporated into the semiconductor integrated circuit.

To achieve the above objects, the invention provides a semiconductor integrated circuit which includes:

a first connecting terminal a first signal processing circuit for receiving a signal from the first connecting terminal to perform a predetermined action, a second connecting terminal connected to a first signal processing circuit for supplying means for setting to a predetermined first level during the predetermined action of the first signal processing circuit 3.

There is a third connecting terminal for receiving a signal, from a second signal processing circuit which generates a signal by performing a predetermined action, Also there is a fourth connecting terminal.

A characteristic changing circuit for changing the characteristic of the integrated circuit so it is a characteristic corresponding to a signal given to the fourth connecting terminal in response to the signal given to the fourth connecting terminal.

A changeover switch for selectively changing over switching between the outputs of the second signal processing circuit and characteristic changing circuit in response to the control signal to apply to the third connecting terminal.

Control signal generating means in response to the signal to apply the second connecting terminal for applying a control signal to the changeover switch so as to actuate the changeover switch SW2 to set in the switching manner to apply the output of the second signal processing circuit to the third connecting terminal when the second connecting terminal is at the first level, and also to actuate the changeover switch to set in the switching manner to apply the output of the characteristic changing circuit to the third connecting terminal when the second connecting terminal is at a predetermined second level.

The elements referred to below are shown in FIGS. 1-3 of the drawings.

In the semiconductor integrated circuit according to the invention, while the first signal processing circuit 3 performs the predetermined action, the second connecting terminal 5 is set at the first level. While this second connecting terminal 5 is at the first level, the switcting manner of the changeover switch SW2 is controlled by the control signal from the control signal generating means, so that the output of the second signal processing circuit 8 may be applied to the third connecting terminal 7. On the other hand, when the second connecting terminal 5 is at the second level, the switching manner of the changeover switch SW2 is controlled by the control signal from the control signal generating means, so that the output of the characteristic changing circuit 2 is applied to the third connecting terminal 7.

The characteristic changing circuit 2, in response to the signal given to the fourth connecting terminal 9, changes the characteristic so as to be a characteristic corresponding to the signal applied to this fourth connecting terminal 9. When the second connecting terminal 5 is set the predetermined second level, the output of the characteristic changing circuit 2 is applied to the third connecting terminal 7. When the characteristic of the characteristic changing circuit 2 is changed by applying a signal to the fourth connecting terminal 9 in this state, the output of the characteristic changing circuit 2 based on the changed characteristic can be led out from the third connecting terminal 7.

At the third connecting terminal 7, the output of the second signal processing circuit 8 is led out during the predetermined action of the first signal processing circuit 3, at the output of the characteristic changing circuit 2 is led out when changing and adjusting the characteristic of the characteristic changing circuit 2. In other words, the function as at least two output terminals is realized in the third connecting terminal 7, and the number of connecting terminals provided in this semiconductor integrated circuit may be decreased.

In a preferred embodiment of the invention, the control signal generating means includes:

a first input terminal 23 for receiving a signal from the second connecting terminal 5.

A second input terminal 24, and a comparator circuit 6 for comparing the output levels of the first input terminal 23 and the second input terminal 24, There is a reference level generating means 25 for generating a reference level signal processing a level between the first and second levels and applying it to the second input terminal 24, in which the output of the comparator circuit 6 is given to the changeover switch SW2 as a control signal.

In a further preferred embodiment of the invention, a predetermined potential is given to the second connecting terminal 5 through a switch SW1. Accordingly, by controlling the conduction and interruption of the switch SW1, the level of the second connecting terminal 5 can be varied, and the changeover of the changeover switch SW2 can be controlled.

In another preferred embodiment of the invention, the characteristic changing circuit 2 is composed so that its characteristic may not depend on the level of the second connecting terminal 5. Therefore, when changing and adjusting the characteristic of the characteristic changing circuit 2, if the level of the second connecting terminal 5 is changed, the characteristic of the characteristic changing circuit 2 is not changed, and the output of the characteristic changing circuit 2 led out to the third connecting terminal 7 depends on the characteristic corresponding only to the signal given to the fourth connecting terminal 9, which contributes to ease of test of the characteristic of the characteristic changing circuit 2.

In a different preferred embodiment of the invention, the first signal processing circuit 3 receives a signal from the first connecting terminal 4, generates a bias voltage when performing a predetermined action and applies this bias voltage to the second connecting terminal 5, thereby setting the second connecting terminal 5 to the first level. That is, the control signal for changing over the changeover switch SW2 is generated at the control signal generating means, and the mode of the control signal from this control signal generating means is determined by the level of the second connecting terminal 5. In other words, the changeover action of the changeover switch SW2 is controlled by the level of the second connecting terminal 5 connected to the first signal processing circuit 3. Thus, as one of the compositions for controlling the changeover action, the first signal processing circuit 3 for performing a predetermined action by receiving a signal from the first connecting terminal 4 is used without adding a new mechanism, so that the entire constitution may be simplified.

In a still further preferred embodiment of the invention, the characteristic changing circuit 2 processes the signal based on the adjusted characteristic by receiving a signal from the signal generating means 12 connected to the semiconductor integrated circuit.

The invention also presets a characteristic test method of a semiconductor integrated circuit which includes:

(a) providing a a semiconductor integrated circuit as described before and including the steps of, detecting the characteristics of the characteristic changing circuit 2 to the third connecting terminal 7.

According to the invention, the characteristic changing signal generating means 26 is connected to the fourth connecting terminal 9 of this semiconductor integrated circuit, and the detecting means 31 is connected to the third connecting terminal 7. In this state of connection, the signal from the characteristic changing signal generating means 26 is applied to the characteristic changing circuit 2 through the fourth connecting terminal 9, and accordingly the characteristic of the characteristic changing circuit 2 is varied. The output of the characteristic changing circuit 2 possessing the varied characteristic can be detected by the detecting means 31. Therefore, the operator can set the characteristic changing circuit 2 in an optimum characteristic only by varying the signal from the characteristic changing signal generating means 26 on the basis of the result of detection obtained from the detecting means 31.

In a preferred embodiment of the invention, the characteristic changing circuit 2 is a filter;

this filter is applied a signal which frequency is continuously changed; and the detecting means 31 is a spectrum analyzer for detecting the level corresponding to the frequency of the signal applied to the filter.

Furthermore, the invention presents an adjusting device of an electronic apparatus provided with a semiconductor integrated circuit which has been described before.

According to the invention, by applying a signal of the predetermined second level to the second connecting terminal 5, the output of the characteristic changing circuit 2 is led out to the third connecting terminal 7. In this state, when a signal is applied from the characteristic changing signal generating means 26 connected to the fourth connecting terminal 9, the characteristic of the characteristic changing circuit 2 is changed. The signal delivered from the characteristic changing circuit 2 thus changed in the characteristic is detected by the detecting means 31. The operator can see the characteristic of the characteristic changing circuit on the basis of the result detected by the detecting means 31, and can adjust the characteristic of the characteristic changing circuit 2 as desired by varying the signal from the characteristic changing signal generating means 26 on the bais of the result of the detection.

In other preferred embodiment of the invention, the adjusting device of an electronic apparatus provided with the semiconductor integrated circuit possesses a fifth connecting terminal 17 for receiving the signal to be changed by the characteristic changing circuit 2, and comprises means 30 for applying the signal to be changed by the characteristic changing circuit 2 to this fifth connecting terminal 17.

The invention also presents an integrated circuit in which a voltage of first specified level is led out into at least one terminal, and a circuit requiring adjustment of characteristic is incorporated within a same chip, comprising:

a switch for connecting the terminal to which the voltage of the first specified level is led out to a different second specified level by force;

an adjusting circuit which requires adjustment of characteristic; and a changeover switch for leading out the output of the adjusting circuit to the output terminal depending on whether the applied voltage of the lead-out terminal is of first specified level or of second specified level.

According to the invention, in the integrated circuit in which it is not necessary to take out the output of the adjusting circuit during the usual operation, the terminal functioning as the output terminal in the usual operation can be used as the terminal for leading out the output signal of the adjusting circuit by changing over in the adjusting process, so that the integrared circuit may be composed without increasing the number of output terminals.

BRIEF DESCRIPTION OF THE DRAWINGS

These and other objects of the invention, as well as the features and advantages thereof, will be better understood and appreciated from the following detailed description and the accompanying drawings, in which.

DETAILED DESCRIPTION OF THE PREFERRED EMBODIMENTS

Figure 1:
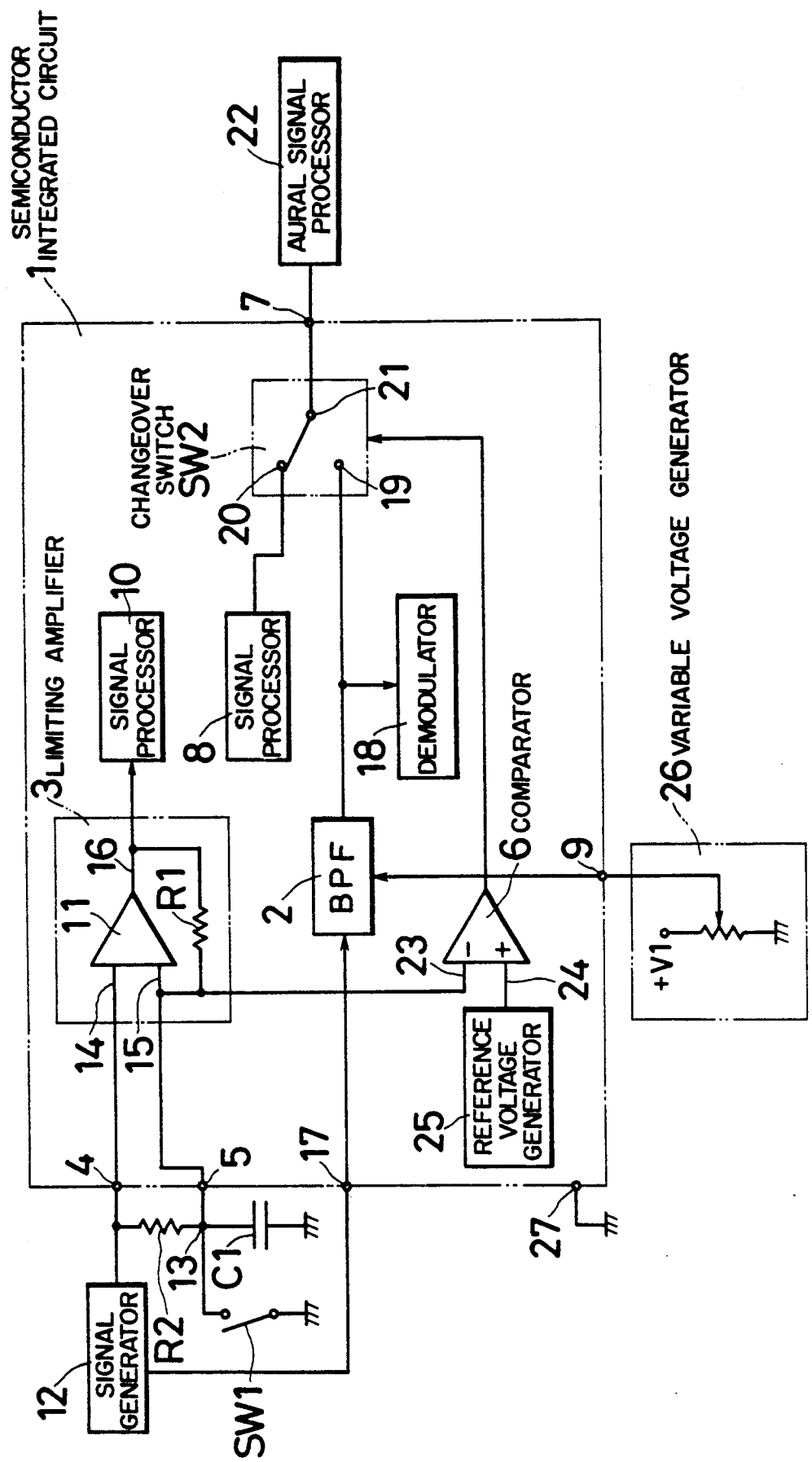
FIG. 1 is a block diagram showing an electric composition of the semiconductor integrated circuit 1 of an embodiment of the invention and an electric composition relating to the semiconductor integrated circuit 1 when the intrinsic action of the semiconductor integrated circuit 1 is realized.

Referring now to the drawings, preferred embodiments of the invention are described in detailed below.

FIG. 1 is a block diagram showing an electric composition the semiconductor integrated circuit 1 of an embodiment of the invention, and an electric composition relating to the semiconductor integrated circuit 1 when the intrinsic action of this semiconductor integrated circuit 1 is realized. The semiconductor integrated circuit 1 of this embodiment is a semiconductor integrated circuit for processing multiplex voice signals of a television receiver, and is composed of one semiconductor integrated circuit chip. In this semiconductor integrated circuit 1, circuits for realizing various functions are incorporated at high density by using, for example, transistors, and it incorporates a circuit necessary for adjusting the characteristic, when realizing its intrinsic action of the semiconductor integrated circuit 1, that is, the multiplex voice signal processing action, such as band pass filter 2.

The semiconductor integrated circuit 1 incorporates a limiting amplifier 3, and connecting terminals 4, 5 of the semiconductor integrated circuit 1 are connected to this limiting amplifier 3. To one connecting terminal 4, a signal generating circuit 12 is connected, and the signal generating circuit 12 generates SAP (second audio program) signal. To this connecting terminal 4, moreover, a resistance R2 and a capacitor C1 are connected in series, and one of the electrodes of the capacitor C1 is grounded. The connecting point 13 of the resistance R2 and capacitor C1 is connected to the other connecting terminal 5.

The limiting amplifier 3 is composed of differential amplifier 11 and feedback resistance R1, and the connecting terminal 4 is connected to one input terminal 14 of the differential amplifier 11, and the other connecting terminal 5 is connected to the other input terminal 15 of the differential amplifier 11. This input terminal 15 is connected to the output terminal 16 of the differential amplifier 11 through the feedback resistance R1, and a specified DC voltage bias by feedback is led out. While this semiconductor integrated circuit 1 is processing multiplex voice signal, this DC voltage bias is applied to the other connecting terminal 5. The output of the limiting amplifier 3 is given to the signal processing circuit 10.

The SAP signal from the signal generating circuit 12 is applied to the band pass filter 2 through the connecting terminal 17 of the semiconductor integrated circuit 1. The output of the band pass filter 2 is applied to a demodulator circuit 18 for modulating the voice multiplex signal, and is also given to one terminal 19 of the changeover switch SW2. At the other terminal 20 of the changeover switch SW2, the output from the signal processing circuit 8 is given. A common terminal 21 of the changeover switch SW2 is connected to the connecting terminal 7 of the semiconductor integrated circuit 1, and this connecting terminal 7 is connected to an aural signal processing circuit 22.

The other input terminal 15 of the differential amplifier 11 is connected to an inverting input terminal 23 of the comparator 6. A non-inverting input terminal 24 of this comparator 6 is provided with a reference voltage from the reference voltage generating circuit 25. The level of this reference voltage is selected between the level of the DC voltage bias and the grounding level. The output of the comparator 6 is given as a changeover control signal to the changeover switch SW2. A variable voltage generating circuit 26 is connected to the connecting terminal 9 of the semiconductor integrated circuit 1, and the voltage from this variable voltage generating circuit 26 is applied to the band pass filter 2. This semiconductor integrated circuit 1 is grounded by way of a connecting terminal 27.

The connecting terminal 5 is grounded through switch SW1, and by turning on this switch SW1, the level of the connecting terminal 5 is changed from the DC bias level to the grounding level. The level of the connecting terminal 5 is given to the inverting input terminal 23 of the comparator 6, and is compared with the reference voltage level from the reference voltage generating circuit 25, and the output of this comparator 6 is given to the changeover switch SW2.

The characteristic of the band pass filter 2 is determined by the DC voltage bias from the variable voltage generating circuit 26 connected through the connecting terminal 9.

In thus composed semiconductor integrated circuit 1, during the intrinsic action of the semiconductor integrated circuit 1, that is, during the voice multiplex signal processing action, the switch SW1 is in OFF state, and the level of the connecting terminal 5 is held at the DC voltage bias of the limiting amplifier 3. The output of the comparator 6 is at low level, and the changeover switch SW2 is changed over so as to apply the output of the signal processing circuit 8 to the connecting terminal 7. That is, in such state, the SAP signal from the signal generating circuit 12 is applied to the signal processing circuit 10 through limiting amplifier 3 to perform a predetermined signal processing action, and is demodulated in the demodulator 18 through the band pass filter 2, and part of the signal is given to the signal processing circuit 8, and the output the signal processing circuit 8 is applied to the aural signal processing circuit 22 by way of the changeover switch SW2.

Figure 2:
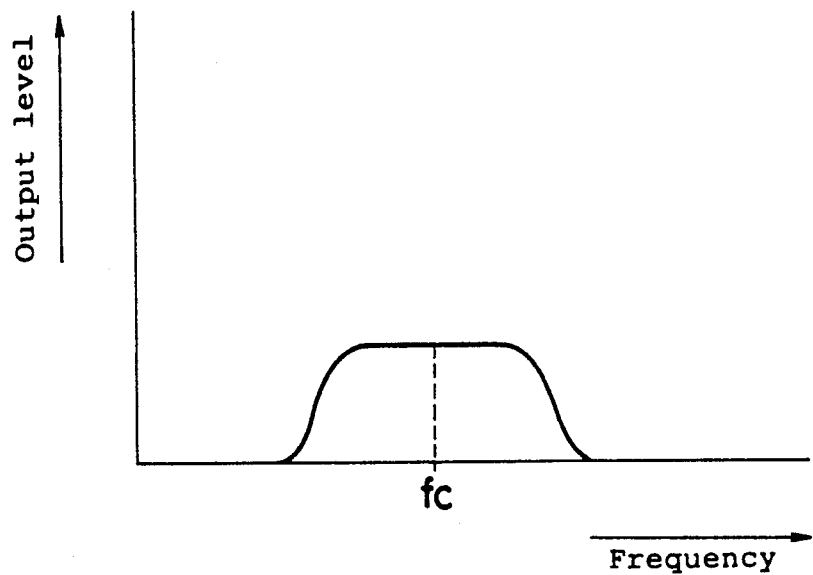
FIG. 2 is a graph showing an electric characteristic of the band pass filter 2.

FIG. 2 is a graph showing the passing band characteristic of the band pass filter 2. The center frequency $f_c$ of the passing band of this band pass filter 2 is determined by the DC voltage applied from the variable voltage generating circuit 26.

Figure 3:
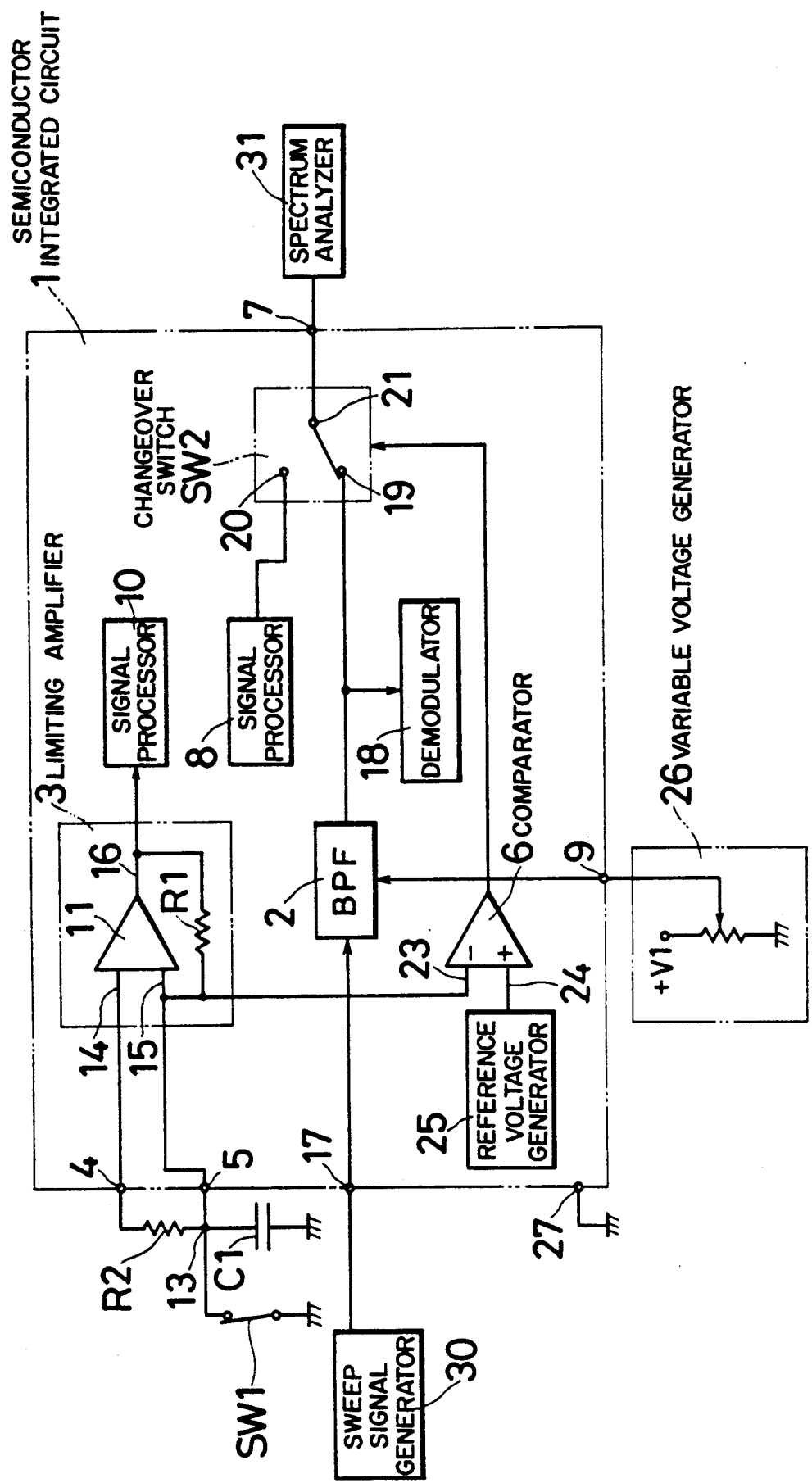
FIG. 3 is a block diagram showing an electric composition of the semiconductor integrated circuit 1 and an electric omposition relating to the semiconductor integrated circuit 1 when adjusting the characteristic of the band pass filter 2.

Next is explained the operation of adjusting the passing band characteristic of the band pass filter 2. When adjusting the characteristic of band pass filter 2, as shown in FIG. 3, the signal generating circuit 12 is disconnected from the connecting terminal 17, and a sweep signal generating circuit 30 is connected instead, and the aural signal processing circuit 22 is disconnected from the connecting terminal 7, and a spectrum analyzer 31 is connected instead, and the switch SW1 is turned on. In this state, since the connecting terminal 5 is grounded, the output of the comparator 6 is set at high level, and the changeover switch SW2 is changed over so as to apply the output of the band pass filter 2 to the connecting terminal 7.

After thus setting, a sweep signal is given to the band pass filter 2 from the sweep signal generating circuit 30 through the connecting terminal 17, and the output passing this band pass filter 2 is detected by the spectrum analyzer 31. In the variable voltage generating circuit 26, by changing and adjusting the voltage to be applied to the band pass filter 2, the center frequency $f_c$ of the passing band of the band pass filter 2 is varied and an optimum characteristic may be determined. When the optimum characteristic is determined in this way, the output level of the variable voltage generating circuit 26 is fixed. Afterwards, by resetting in the circuit composition as shown in FIG. 1, the operation of the voice multiplex signal processing based on the optimum characteristic of the band pass filter 2 may be realized.

Thus, in this invention, since the connecting terminal 7 which is used in the intrinsic action of the semiconductor integrated circuit 1 is used also as the output terminal when adjusting the characteristic of the band pass filter 2, the number of connecting terminals may be decreased. Besides, according to this embodiment, the characteristic of the band pass filter 2 incorporated in the semiconductor integrated circuit 1 may be easily tested and adjusted. Incidentally, in this embodiment, the structure of using band pass filter 2 as the characteristic changing circuit to be incorporated in the semiconductor integrated circuit 1 is explained, but it is not limited to the band pass filter, and other circuits may be similarly applied.

In this embodiment, meanwhile, since the limiting amplifier 3 to be used in the intrinsic action of the semiconductor integrated circuit 1, that is, the voice multiplex signal processing action is also used in the control of changeover action of the changeover switch SW2, it is not necessary to add a new mechanism for controlling the changeover switching action of the changeover switch SW2, which contributes to simplification of the mechanism of the semiconductor integrated circuit 1.

Besides, in this embodiment, the mechanism for controlling the changeover action of the changeover switch SW2 by using the limiting amplifier 3 is explained, but as the circuit for composing a control signal for controlling the changeover action of the changeover switch SW2 it is not limited to the limiting amplifier, and other circuits to be used in the intrinsic action of the semiconductor integrated circuit 1 may be similarly employed.

This invention may be also embodied in various forms without departing from its true spirit and principal features. It should be hence noted that the foregoing embodiments are mere illustrative examples, in all aspects, and the scope of the invention is as mentioned in the appended claims, and is not limited by the statements in this specification whatsoever.

It is sequentially understood that all modifications and changes as fall within the scope of the claims are included in the scope of the invention.

What is claimed is:

1. A semiconductor integrated circuit comprising:
   a first connecting terminal operatively connected to,
   a first signal processing circuit for receiving a signal from the first connecting terminal to perform a predetermined function,
   a second connecting terminal connected to the first signal processing circuit for supplying means for setting to a predetermined first level a signal during the predetermined function of the first signal processing circuit,
   a third connecting terminal,
   a second signal processing circuit for generating a signal by performing a predetermined function,
   a fourth connecting terminal,
   a changing circuit that has characteristics that can be changed so as to have a characteristic corresponding to a signal given to the fourth connecting terminal,
   a switch for selectively connecting the outputs of the second signal processing circuit and changing circuit in response to a control signal to apply signals to the third connecting terminal, and
   control signal generating means for responding to a signal applied to the second connecting terminal, for applying a control signal to the switch for actuating the switch to set the switch in a first mode in order to apply the output of the second signal processing circuit to the third connecting terminal when the second connecting terminal is at the predetermined first level, and also in a second mode to change the switch in order to apply an output of the changing circuit to the third connecting terminal when the second connecting terminal is at a predetermined second level.

2. A semiconductor integrated circuit according to claim 1, wherein the control signal generating means comprises:
   a first input terminal for receiving a signal from the second connecting terminal,
   a second input terminal,
   both of said first and second input terminals operatively connected to a comparator circuit for comparing output levels of the first input terminal and the second input terminal, and
   reference level generating means for generating a reference level signal possessing a level between the output levels, and applying it to the second input terminal, in which
   an output of the comparator circuit is given to the switch as a control signal.

3. A semiconductor integrated circuit according to claim 1, wherein the second connecting terminal is provided with a predetermined potential through another switch.

4. A semiconductor integrated circuit according to claim 1, wherein the changing circuit includes means so that characteristics of the changing circuit may not depend on the level of the second connecting terminal.

5. A semiconductor integrated circuit according to claim 1, wherein the first signal processing circuit receives a signal from the first connecting terminal, and generates a DC voltage bias when performing a predetermined function, and applies said DC voltage bias to the second connecting terminal for setting said second connecting terminal at first level.

6. A semiconductor integrated circuit according to claim 1, wherein the changing circuit receives a signal from a signal generating means connected to the semiconductor integrated circuit, and processes the signal according to a characteristic of said changing circuit.

7. A characteristic test method for a semiconductor integrated circuit as set forth in claim 1 comprising the steps of:
(a) connecting signal generating means for varying characteristics of the changing circuit by applying a signal which level is continuously changed at the fourth connecting terminal and
(b) connecting detecting means for detecting characteristics of the changing circuit at the third connecting terminal.

8. A characteristic test method of a semiconductor integrated circuit according to claim 7, wherein the changing circuit is a filter,
said filter being provided with a continuously changing frequency signal, and
the detecting means is a spectrum analyzer for detecting the level corresponding to the frequency of the signal applied to the filter.

9. An adjusting device of an electronic apparatus provided with a semiconductor integrating circuit comprising:
a semiconductor integrated circuit composed of
a first connecting terminal,
a first signal processing circuit for receiving a signal from the first connecting terminal to perform a predetermined function,
a second connecting terminal connected to the first signal processing circuit for supplying means for setting to a predetermined first level a signal during the predetermined function of the first signal processing circuit,
a third connecting terminal,
a second signal processing circuit for generating a signal by performing a predetermined function,
a fourth connecting terminal for receiving a signal,
a changing circuit that has characteristics that can be changed so as have a characteristic corresponding to a signal given to the fourth connecting terminal,
a switch for connecting the outputs of the second signal processing circuit and the changing circuit in response to the control signal to apply signals to the third connecting terminal, and
control signal generating means for responding to a signal applied to the second connecting terminal, for applying a control signal to the switch for actuating the switch to set the switch in a first mode in order to apply the output of the second signal processing circuit to the third connecting terminal when the second connecting terminal is at the predetermined first level, and also to set the switch in a second mode to change the switch in order to apply an output of the changing circuit to the third connecting terminal when the second connecting terminal is at a predetermined second level,
means for applying a signal, processing a predetermined second level to the second connecting terminal; and
signal generating means for changing characteristics connected to the fourth connecting terminal for applying a signal for changing characteristics of the changing circuit; and
detecting means connected to the third connecting terminal for detecting the signal from the changing circuit.

10. An adjusting device of an electronic apparatus provided with a semiconductor integrating circuit according to claim 9, wherein the semiconductor integrated circuit further includes a fifth connecting terminal for receiving a signal to be changed by the changing circuit,
and comprises means for applying a signal to be changed by the changing circuit to the fifth connecting terminal.

11. An integrated circuit in which a voltage of a first specified level is fed into at least one terminal of an integrated circuit which requires adjustment of at least one characteristic, comprising:
a first circuit used during normal operation of the integrated circuit operatively connected to a terminal during normal operation;
a switch having a plurality of operating modes, connected in a first mode to said first circuit for operatively connecting said first circuit to said terminal; and
a second circuit having characteristics that can be adjusted incorporated in said integrated circuit said second circuit operatively connected to a third circuit during the normal operation;
said switch operatively connecting an output of said second circuit to said terminal when said second circuit is adjusted.

12. The apparatus of claim 11 wherein said first circuit is a signal processor and said second circuit is a bandpass filter.

13. A method of adjusting a circuit that has at least one variable characteristic of the circuit being part of an integrated circuit comprising the steps of:
(a) a plural mode switch operatively connecting a first circuit to an output terminal in a first mode; and
(b) said plural mode switch disconnecting said first circuit from said output terminal and said plural mode switch connecting the circuit having the at least one variable characteristic to said output terminal in a second mode.

14. The method of claim 13 wherein an electrical signal is applied to said circuit having variable characteristics from outside said integrated circuit during a time when said switch is in the second mode.

* * * * *